United States Patent [19]

Kinney et al.

[11] Patent Number: 5,222,105
[45] Date of Patent: Jun. 22, 1993

[54] OPTO-ELECTRONIC INTERFACE FOR DECODING WAVE DIVISION MULTIPLEXED MANCHESTER GRAY CODED BINARY SIGNALS

[75] Inventors: Terrance R. Kinney, South Bend; Stephen M. Emo, Elkhart, both of Ind.

[73] Assignee: Allied-Signal Inc., Morristown, N.J.

[21] Appl. No.: 693,744

[22] Filed: Apr. 30, 1991

[51] Int. Cl.⁵ .............................. H04L 27/22
[52] U.S. Cl. ............................ 375/87; 341/70; 359/115
[58] Field of Search ............ 375/55, 87, 110; 341/70; 359/158, 115, 175; 360/44

[56] References Cited
U.S. PATENT DOCUMENTS 4,361,895 11/1982 Khoudari .................. 360/44
4,363,002 12/1982 Fuller ...................... 375/87
4,608,702 8/1986 Hirzel et al. ............. 375/110
4,661,965 4/1987 Maru ....................... 375/87

Primary Examiner—Stephen Chin
Attorney, Agent, or Firm—Leo H. McCormick; Larry J. Palguta; Robert A. Walsh

[57] ABSTRACT

An arrangement and technique for decoding optical wave division multiplexed Manchester Gray coded serial binary signals is disclosed wherein synchronization information is utilized to establish a preferred timing of bits of data and then the incoming signal is monitored to detect data bits appearing within prescribed bounds of permissible timing variation from the preferred timing. When a bit is detected within these prescribed bounds, it is reset to appear at the time at which it should have occurred according to the preferred timing.

11 Claims, 2 Drawing Sheets

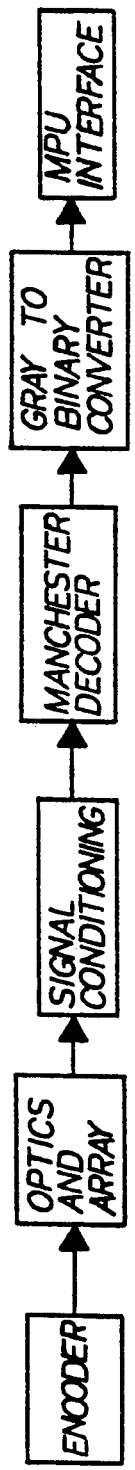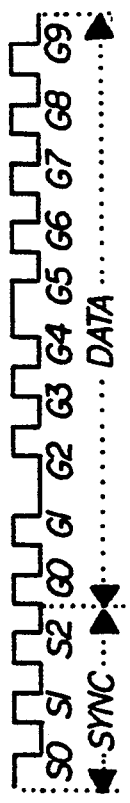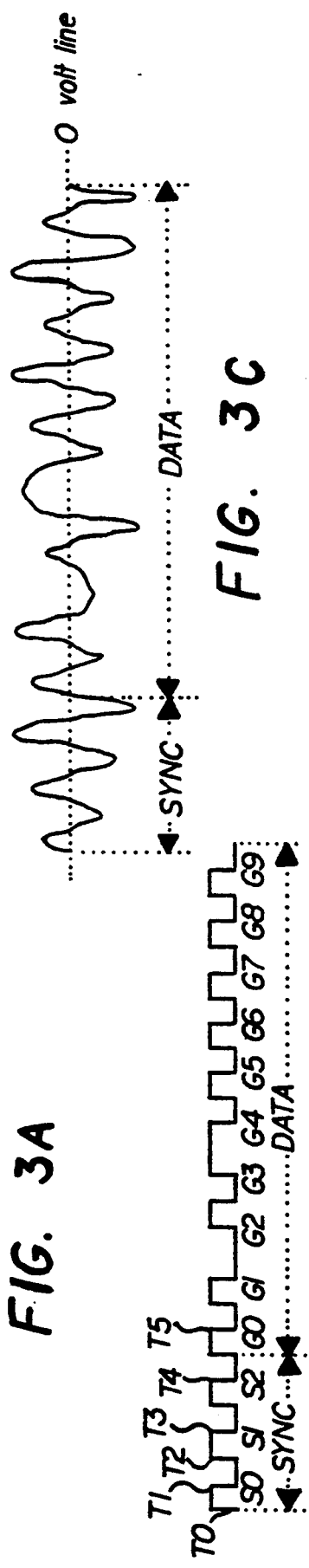

OPTO-ELECTRONIC INTERFACE FOR DECODING WAVE DIVISION MULTIPLEXED MANCHESTER GRAY CODED BINARY SIGNALS

The present invention relates generally to the fiber optic transmission and reception of information and more particularly to a novel scheme for decoding such information.

A synchronization pattern precedes each data word to provide both timing information and information on where the data word begins. This feature enables the use of non-absolute wavelengths such that relative positioning of the sensor optics to the encoding mask including eccentricity of the encoding mask on the shaft does not affect the decoding tolerance. Further the algorithm is structured to allow any one bit anywhere in the data stream to be missing. The missing bit may be set to either a ONE or a ZERO, but if, for example, two or more bits are missing, a fault indication occurs.

Among the several objects of the present invention may be noted the provision of a wave division multiplexed signal decoder; the provision of such a decoder particularly suited to Manchester Gray coded data; the provision of a relative (as opposed to absolute) wavelength encoding scheme; and the provision of a data receiving system which reestablishes timing of received data based on the timing of synchronization signals which precede the data. These as well as other objects and advantageous features of the present invention will be in part apparent and in part pointed out hereinafter.

In general, a method of detecting and decoding Manchester encoded data of a type where each incoming data word is preceded by a multibit synchronization pattern includes confirming the reception of a valid synchronization pattern and from that pattern determining the time duration of a received bit within that valid synchronization pattern. As an alternative, the bit duration may be predetermined at the receiving end. A permissible time window is then established from the determined time duration and then data transitions occurring within that permissible window are sensed. Upon sensing a transition within the window, the time of that transition is reestablished to occur at the time at which it should have occurred according to the previously determined bit width. The steps of sensing and reestablishing are repeated for each data bit in a data word to thereby form a reconstructed data word.

Also in general and in one form of the invention, a method of detecting, decoding and retiming optically transmitted wave division multiplexed Manchester encoded data signals includes converting an incoming wave division multiplexed optical signal to a time domain electrical signal and then removing undesired signal components having frequencies above a predetermined frequency from that time domain signal. Any undesired amplitude modulated signal components may be removed from the time domain signal by taking the second derivative of the time domain signal. Removal of undesired signal components may be accomplished in an interleaved manner by differentiating, then filtering followed by a further differentiation and second filtering. The time of occurrence of the zero crossings of the originally transmitted signal may be reconstructed from the times at which the time domain signal, with the undesired components removed, changes between concave upwardly and concave downwardly. These zero crossing times may then be further processed as in the previous paragraph.

It is an object of this invention to provide a method of decoding information from encoded information by sensing multibit synchronized patterns with a time duration.

It is a further object of this invention to provide a method for decoding relative spectral data.

It is another object of the invention to provide such a method which eliminates errors in data decoding.

Yet another object of the invention is to provide a method which enables the accurate and reliable transmission of binary coded spectral data.

Another object of the invention is to provide a method in which a detected data spectrum which is further Manchester encoded is decoded without previous knowledge of absolute wavelengths and provides for variability in data spectral bit width.

Yet another object of the invention is to provide automatic level compensation of incoming relative spectral data.

Another object of the invention is to provide a method which allows decoding of Manchester encoded relative spectral data having variation in spectral bit width of predetermined number of data bits who vary outside a predetermined allowable range.

Yet another object of the invention is to provide a method which converts a Manchester gray coded optical spectrum to parallel binary electrical data.

Another object of the invention is to provide decoding of a Manchester gray coded optical spectrum with either a predetermined optical spectral bit width or automatically measure a sync pattern within the encoded optical spectrum for determination of the optical spectral bit width.

Yet another object of the invention is to provide a decoding interface circuit which is easy for the MPU to communicate with, yet is flexible enough to handle variations in the amplitude and spectral position of the relative spectral data.

BRIEF DESCRIPTION OF THE DRAWING

FIG. 1 is a generalized schematic block diagram of a system for encoding, transmitting and decoding information such as position information with emphasis on function;

FIGS. 3a and 3b are illustrative waveforms of Manchester encoded data with a synchronization pattern followed by a data bit stream; and FIG. 3c is an analog waveform for the particular data word of FIG. 3b as it appears earlier in the circuit.

Corresponding reference characters indicate corresponding parts throughout the several views of the drawing.

Figure 2:
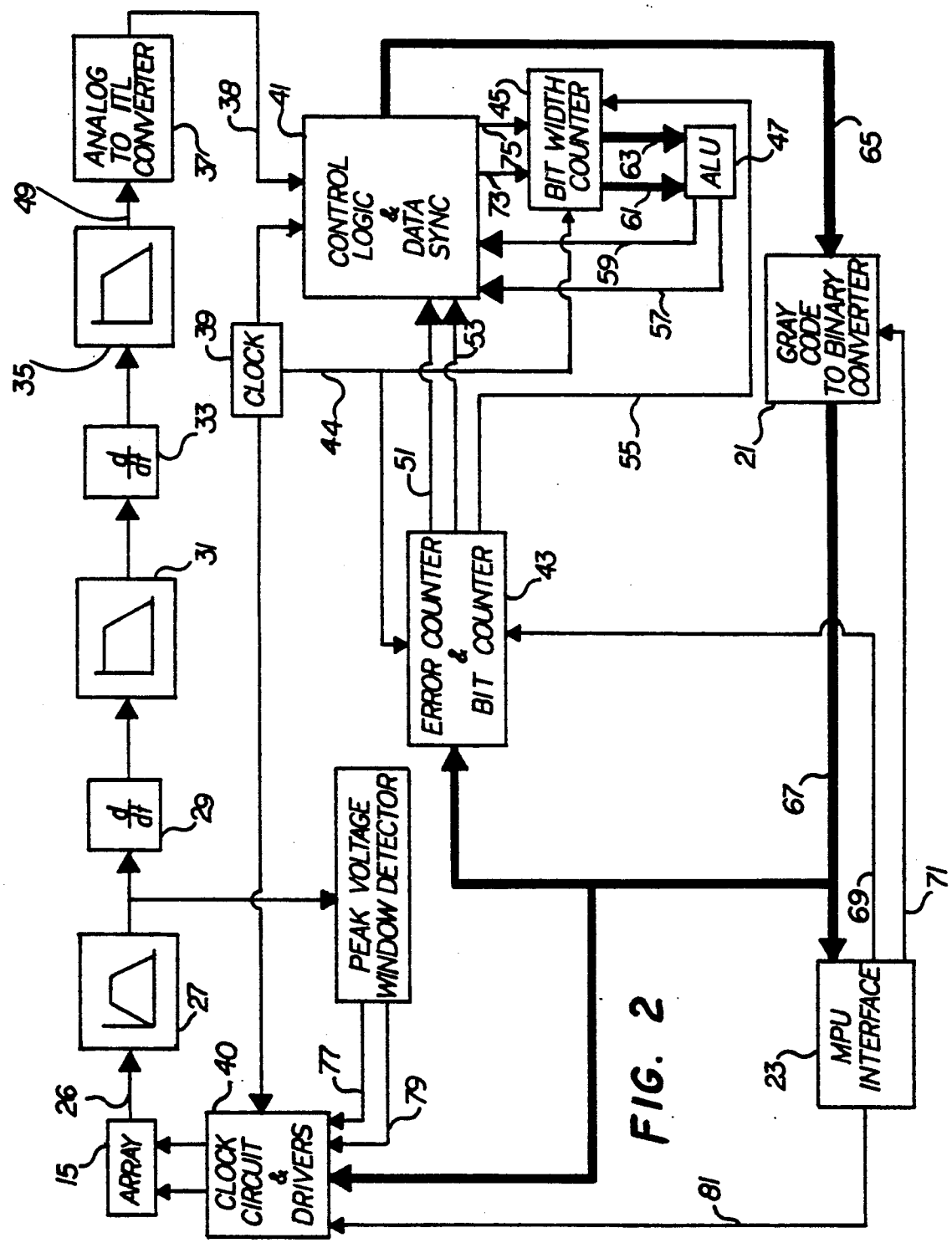
FIG. 2 is a more detailed schematic block diagram emphasizing the structure of the information decoding portion of FIG. 1.

The exemplifications set out herein illustrate a preferred embodiment of the invention in one form thereof and such exemplifications are not to be construed as limiting the scope of the disclosure r the scope of the invention in any manner.

DESCRIPTION OF THE PREFERRED EMBODIMENT

Referring first to FIG. 1, the encoder 13 may be of the type disclosed in Arnett U.S. Pat. No. 5,004,910 wherein light is modified by an encoder disk on a rotating shaft to generate and transmit position information along a fiber optic path 11. The position information may be wave division multiplexed (individually modulated spectral elements) and the demultiplexing may be accomplished by the optics and array section 15, for example, as disclosed in the Kinney et al U.S. Pat. No. 4,852,079 entitled OPTICAL SPECTRUM ANALYZER. The signal conditioning circuit 17 is a series of analog circuits 27-37 and 40 of FIG. 2 followed by some digital data processing circuits 41-47. The conditioned signal is then decoded at 19 and converted to a binary code at 21 and forwarded to the MPU interface 23.

In FIG. 2, the analog circuitry is seen to include the clock circuit and drivers 40 which provide the level conversions and drive voltages required by the optical detector array 25, a buffer amplifier and bandpass filter 27, a peak voltage window detector 28, a differentiator 29 and low pass filter 31 followed by a second differentiator 33 and second low pass filter 35, and finally, an analog to digital converter 37. The clock circuit and drivers 40 provides the proper voltage levels and rise times required by the optical detector array 15 without any ringing of the timing signals due to transmission line mismatch. The buffer amplifier and bandpass filter 27 which isolates the signal output of the optical detector array 15, amplifies the signal to an appropriate level and reduces any DC offset voltage as well as any high frequency component due, for example, to noise or pixel switching transients. The peak voltage window detector 28 includes two level comparators each of which compares the analog signal on line 26 to its associated preset reference voltage and provides two TTL level outputs on 77 and 79 respectively, which correspond to the analog signal relative to their two respective reference voltages, for later processing by the clock circuit 40 in the digital portion of the circuit. A high level output occurs on line 77 or line 79 when the analog signal exceeds the respective reference voltage of the corresponding level comparator.

The two consecutive stages of differentiator and subsequent low pass filter, 29, 31, and 33, 35 respectively, combine to construct the second derivative of the analog signal which eliminates any variations in amplitude while preserving the encoded data bit edge timing. Bessel filters 31 and 35 are employed to reduce high frequency noise associated with differentiators while maintaining data bit edge to data bit edge timing. Each differentiator and filter combination has unity gain to eliminate the possibility of any open section of the analog circuitry from saturating, thus increasing the overall amplitude operating range. The analog to TTL converter 37 employs a voltage comparator and conditioning circuitry. The conditioning circuitry provides dead band and hysteresis to remove low level noise which could cause multiple edges to occur at the analog zero crossing, while preserving the data bit edge timing.

An incoming signal on line 26 may include significant noninformation bearing amplitude modulation as well as other noise. The zero crossings of the original signal may be reconstructed by looking for those points in the signal where the signal changes from concave upwardly to concave downwardly. These points correspond to the zero crossings of the second derivative signal of FIG. 3c which appears on line 49. Noise components having frequencies well above the repetition rate of the desired data signal have been removed by the low pass filters 31 and 35. The comparator provides a TTL logic level conversion of the analog signal, switching from high to low, or low to high at the zero crossings of the analog signal, compare FIGS. 3b and 3c.

The digital data processing circuitry converts the TTL logic level serial data stream into a registered parallel binary word on line 67 representing the relative position of the optic position sensor. The digital circuitry also provides all the timing logic to drive the optical detector array 25, adjust integration time for that detector array, and provide all the required logic to interface to a Micro Processor Unit (MPU) at 23. The MPU, in turn, supplies or loads certain parameters into the digital portion of the system. For example, the error and bit counter 43 receives the number of permissible errors in a data word (typically one) and the number of data bits in a data word (ten as illustrated in FIG. 3) on line 67. The bit count is passed on to the control logic and data synchronization unit 41 on line 53 and the error count is transmitted to the control logic and data synchronization unit 41 on line 51. Information on the width of a bit is passed to the bit width counter 45 on line 55 while upper and lower limits of the bit width are returned from the ALU 47 to the control logic and a data synchronization unit 41 on lines 57 and 59. The bit width counter 45 receives or is latched to the measured width of the first synchronization bit. This bit width as supplied to bit width counter 45 may also be determined and loaded from the ALU 47. The bit width counter 45 is cleared or returned to its original count by a clear signal on line 63.

The TTL logic level serial data on line 38 is encoded as a Manchester Gray coded binary word with a preceding three bit serial synchronization (sync) pattern. Illustrative patters are shown in FIGS. 3a and 3b. The three sync bits S0, S1, and S2 are the same regardless of the particular ten bit number represented by the subsequent bits. The data is Manchester encoded, that is, a binary ONE is represented by a transition from "high" or "on" to "low" or "off" while a binary ZERO is indicated by a "low" followed by a "high". Under the first convention and ignoring the three sync bits, FIG. 3a depicts the bit sequency 1100011111 while FIG. 3b depicts the next larger number 1100111111 in bit position G0-G9 respectively. It will be noted that in a pure binary code these two numbers certainly are not consecutive. The two binary words are in a Gray code where any two sequential numbers differ from one another in exactly one bit position. The three sync bits S0, S1, and S2 are used to set up the bit width timing and the starting point. Corresponding retimed Gray coded data on line 65 would appear much the same, but would lack the three leading synchronization bits.

The digital logic circuitry 41 decodes this data stream on line 38 by first measuring the time of the first bit of the synchronization pattern's high and low states for equity within a predetermined timing window. If the high and low states fail this test, the circuitry resets and continues to look for a valid data sync pattern.

Next, circuitry 41 measures the time between the first falling edge of the sync pattern and the second falling edge. This time is ten compared to the time accumulated between the second falling edge and the third falling edge for equity within the predetermined timing window. If this test is failed, the circuitry resets and continues to look for a valid data sync pattern. Thereafter, circuitry 41 looks for edges falling within a predetermined timing window with respect to the measured time between the first and second falling edges of the sync pattern. Also at this time, the error counter 43 is reset to zero, the error flag is reset, the edge detected flag is reset, and latches monitoring the peak voltage window detectors are reset. If multiple edges are detected before this window, an error is noted by setting the error flag. If an edge is detected within this predetermined timing window, the edge is noted by setting the edge detected flag. When the trailing outer edge of the predetermined timing window occurs: the bit width counter 45 is reset to the value it would have obtained had it been reset to zero at exactly the time of the measured sync's first falling edge to the sync's second falling edge; the error counter 43 is incremented if the error flag is set or the edge detected flag is not set; the flags are reset and the level of the data is noted; and then the bit width counter 45 proceeds to look for the next edge within the predetermined timing window. If errors greater than a predetermined number are detected, the conversion is stopped, and an error status bit is set for interrogation by the MPU 23. If the number of edges falling within the predetermined timing windows plus the number of errors equal a predetermined number of data bits, the conversion is stopped, the logic levels of the data stream preceding each edge within these timing windows are serially latched, a Gray code to binary conversion is conducted by converter 21 and the resulting binary data is latched for later interrogation by an output enable signal on line 71 from the MPU 23.

Converter 21 may be a conventional exclusive OR and shift register arrangement for converting the serial Gray coded data on line 65 to parallel data on line 67. concurrently, a valid conversion status bit is set for later interrogation on line 71 by the MPU 23.

Upon the occurrence of a rising edge in the integrator latch signal on line 81, an integration time is loaded into an integrator in clock circuit 40 and array timing is initiated. A signal generated from the integrator is used to energize a light emitting diode light source of the type more fully described in the above mentioned U.S. Pat. No. 5,004,910 for a period of time as loaded into the integrator.

Referring now primarily to FIG. 3b, the control logic 41 waits for a reset signal and then commences looking for a first rising edge on line 38. Upon the occurrence of that first rising edge at T0, bit width counter commences counting the clock signals on line 44. Upon the occurrence of the first falling edge at T1, the elapsed time (which should be one half cycle) is compared and if it falls between ⅜ and ⅝ of a predetermined bit width value N (i.e., one cycle of the synchronization square wave), the circuit 41 continues to look for a second rising edge. If the elapsed time is not within these limits, the circuit 41 begins a new to look for a first rising edge. Otherwise, at the second rising edge (T2) the elapsed time is again checked to see if it falls between ⅜ and 5/4 of the bit width time N. If the elapsed time is not within these limits or if multiple rising edges were detected, the circuit resets and begins anew to look for a first rising edge. Otherwise, the counter 45 is reset and the circuit 41 looks for the second falling edge at T3. The time between T3 and T4 where the next falling edge occurs is determined. If this time is less than ⅜ N and the falling edge has occurred, the circuit 41 resets and begins anew to look for a first rising edge. When the count at 45 reaches 5/4 N, and no falling edge has yet occurred, the circuit 41 resets and begins anew to look for a first rising edge. If neither of these two things has occurred, the count at 45 is preset to ¼ N, and the circuit looks for any edge. If multiple edges occur before a time of ⅜ N has elapsed, the error counter 43 is incremented by one. When a time of 5/4 N has elapsed and no edges have occurred, the error counter 43 is incremented in any case, the logic level of the signal at this time is outputted to converter 21, the count on counter 45 is preset to ¼ N and the process repeated for the number of bits (nine additional in the illustrated example) in a data word as loaded into bit counter 43. At the end of the repetitions, if the error count still does not exceed one, a good convert is indicated, and the converted binary parallel word describing the sensor position is latched into an interface for inspection by the MPU 23. If the error count has exceeded one, an error is indicated and the binary parallel word is not latched. While no more than one is preferred, any acceptable number of errors may be set in counter 43. Moreover, use of either a preset value for bit width duration or a value determined from the incoming signal synchronization pattern is contemplated.

During a conversion, if either peak voltage detector within the peak voltage window detector 28 detects a level greater than its respective reference voltage, this occurrence is latched (lines 77 and 79) for interrogation by control logic within the clock circuit and drivers 40. This information allows the clock circuit and drivers 40 to adjusts the integration timing circuitry higher if no latches are set and lower if both latches are set so as to maintain a proper output voltage level from the analog circuitry. In other words, if the most recent conversion is too high, the integration time is decreased and if that conversion was too low, the integration time is incremented.

From the foregoing, it is now apparent that a novel Manchester encoded data decoding arrangement has been disclosed meeting the objects and advantageous features set out hereinbefore as well as others, and that numerous modifications as to the precise shapes, configurations and details may be made by those having ordinary skill in the art without departing from the spirit of the invention or the scope thereof as set out by the claims which follow.

We claim:

1. The method of detecting and decoding Manchester encoded data where each data word is preceded by a multibit synchronization pattern comprising the steps of:
   confirming reception of a valid synchronization pattern;
   determining the time duration of a bit from a received valid synchronization pattern;
   establishing a permissible time window from the determined time duration;
   sensing for data transitions within said permissible window; and
   upon sensing a transition within said window, reestablishing the time of that transition to the time at which it should have occurred according to the determined bit duration.

2. The method of detecting and decoding Manchester encoded data according to claim 1 further including the step of:
   repeating the steps of sensing and reestablishing for each data bit in a data word to thereby form a reconstructed data word.

3. The method of detecting and decoding Manchester encoded data according to claim 1 including the steps of;

maintaining a count of the number of times the permissible window contains no transition; and indicating an invalid detection if the count exceeds a predetermined value.

4. The method of detecting and decoding Manchester encoded data according to claim 1 including the additional steps of;

indicating receipt of one type binary digit upon sensing a rising transition within the permissible window; and indicating receipt of the other type binary digit when a falling transition is sensed within the permissible window.

5. The method of detecting and decoding Manchester encoded data according to claim 4 further includes the step of;

repeating the steps of sensing, reestablishing and indicating receipt of the type binary digit for each data bit in a data word to thereby form a reconstructed data word.

6. The method of detecting decoding and retiming Manchester encoded data where each data work is preceded by a multibit synchronization pattern to confirm reception of a valid synchronization pattern comprising the steps of:

determining a preferred time duration of a bit;

establishing a permissible time window from the preferred time duration;

sensing for data transitions within said permissible window; and upon sensing a transition within the window, reestablishing the time of that transition to the time at which it should have occurred according to the determined bit duration.

7. The method of detecting, decoding and retiming Manchester encoded data according to claim 6 including the additional steps of indicating receipt of one type binary digit upon sensing a rising transition within the permissible window and indicating receipt of the other type binary digit when a falling transition is sensed within the permissible window.

8. The method of detecting, decoding and retiming optically transmitted wave division multiplexed Manchester encoded data signals comprising the steps of:

converting an incoming optical wave division multiplexed signal to an electrical time domain signal;

removing undesired signal components having frequencies above a predetermined frequency from the time domain signal;

removing undesired amplitude modulated signal components from the time domain signal by taking the second derivative of the time domain signal; and reconstructing the time of occurrence of the zero crossings of the original time domain signal from the times at which the time domain signal with undesired components removed changes between concave upwardly and concave downwardly.

9. The method of claim 8 wherein the originally transmitted signal includes data words each of which is preceded by a multibit synchronization pattern to confirm reception of a valid synchronization pattern, including the additional steps of further processing the reconstructed time of occurrence of the zero crossings by:

determining the preferred time duration of a bit;

establishing a permissible time window from the preferred time duration;

sensing for data transitions within said permissible window; and upon sensing a transition within the window, reestablishing the time of that transition to the time at which it should have occurred according to the determined bit duration.

10. The method of claim 9 including the additional steps of:

indicating receipt of one type binary digit upon sensing a rising transition within the permissible window; and indicating receipt of the other type binary digit when a falling transition is sensed within the permissible window.

11. The method of claim 8 wherein the removal of undesired signal components is accomplished in an interleaved manner by differentiating and then filtering the domain signal and thereafter performing a second differentiation and second filtering of the time domain signal.

* * * * *